(12) United States Patent
Park et al.

(10) Patent No.: US 7,924,644 B2
(45) Date of Patent: Apr. 12, 2011

(54) SEMICONDUCTOR MEMORY DEVICE INCLUDING FLOATING BODY TRANSISTOR MEMORY CELL ARRAY AND METHOD OF OPERATING THE SAME

(75) Inventors: Duk-ha Park, Suwon-si (KR);
Ki-Whan Song, Yongin-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 8 days.

(21) Appl. No.: 12/348,036

(22) Filed: Jan. 2, 2009

(65) Prior Publication Data
US 2009/0175098 A1 Jul. 9, 2009

(30) Foreign Application Priority Data

Jan. 3, 2008 (KR) .................. 10-2008-0000826

(51) Int. Cl.
*G11C 7/00* (2006.01)
(52) U.S. Cl. ..................................... 365/222
(58) Field of Classification Search ............ 365/222
See application file for complete search history.

(56) References Cited

U.S. PATENT DOCUMENTS

| | | | |
|---|---|---|---|
| 5,146,152 A | 9/1992 | Jin et al. | |
| 5,998,840 A | 12/1999 | Kim | |
| 6,055,183 A | 4/2000 | Ho et al. | |
| 6,084,812 A | 7/2000 | Joo | |
| 6,147,903 A | 11/2000 | Takahashi | |
| 6,475,890 B1 | 11/2002 | Yu | |
| 6,567,330 B2 | 5/2003 | Fujita et al. | |
| 6,621,725 B2 | 9/2003 | Ohsawa | |
| 6,697,909 B1 * | 2/2004 | Wang et al. | 711/106 |
| 6,826,074 B2 | 11/2004 | Yamauchi | |
| 6,861,689 B2 | 3/2005 | Burnett | |
| 6,882,008 B1 | 4/2005 | Ohsawa | |
| 6,982,918 B2 | 1/2006 | Fazan et al. | |

(Continued)

FOREIGN PATENT DOCUMENTS

JP 04-366492 12/1992

(Continued)

OTHER PUBLICATIONS

Ohsawa et al., "Memory Design Using a One-Transistor Gain Cell on SOI," IEEE Journal of Solid-State Circuits, vol. 37, No. 11, Nov. 2002, pp. 1510-1522.

(Continued)

*Primary Examiner* — Huan Hoang
*Assistant Examiner* — Anthan T Tran
(74) *Attorney, Agent, or Firm* — Volentine & Whitt, P.L.L.C.

(57) ABSTRACT

A semiconductor memory device includes a memory cell array including a plurality of memory cells, where each memory cell includes a transistor with a floating body region in which majority carriers are accumulated in a steady state. In write and read operations, a first data state corresponding to the steady state is written to and read from at least one selected memory cell of the memory cell array by supplying a first bipolar current through the at least one selected memory cell, and a second data state is written to and read from the at least one selected memory cell by supplying a second bipolar current which is smaller than the first bipolar current through the at least one selected memory cell. In a refresh operation, memory cells of the memory cell array storing the second data state are refreshed.

19 Claims, 13 Drawing Sheets

U.S. PATENT DOCUMENTS

| | | | |
|---|---|---|---|
| 7,064,973 B2 * | 6/2006 | Peng et al. | 365/149 |
| 7,075,151 B2 | 7/2006 | Shino | |
| 7,098,507 B2 | 8/2006 | Tang et al. | |
| 7,154,788 B2 | 12/2006 | Takemura et al. | |
| 7,187,581 B2 | 3/2007 | Ferrant et al. | |
| 7,233,536 B2 | 6/2007 | Ogiwara et al. | |
| 7,301,803 B2 | 11/2007 | Okhonin et al. | |
| 7,326,634 B2 | 2/2008 | Lindert et al. | |
| 7,436,724 B2 | 10/2008 | Nandi | |
| 2002/0057622 A1 * | 5/2002 | Sim | 365/230.03 |
| 2003/0231524 A1 | 12/2003 | Ohsawa | |
| 2005/0026354 A1 | 2/2005 | Bhattacharyya | |
| 2005/0068807 A1 | 3/2005 | Ohsawa | |
| 2005/0180214 A1 | 8/2005 | Park | |
| 2006/0081851 A1 | 4/2006 | Ono | |
| 2006/0092739 A1 | 5/2006 | Fujita et al. | |
| 2006/0131650 A1 | 6/2006 | Okhonin et al. | |
| 2006/0138558 A1 | 6/2006 | Morikado | |
| 2006/0208301 A1 | 9/2006 | Shino | |
| 2007/0007574 A1 | 1/2007 | Ohsawa | |
| 2007/0013007 A1 | 1/2007 | Kusunoki et al. | |
| 2007/0023809 A1 | 2/2007 | Villaret et al. | |
| 2007/0058427 A1 | 3/2007 | Okhonin et al. | |
| 2007/0091703 A1 | 4/2007 | Nishimura et al. | |
| 2007/0097751 A1 * | 5/2007 | Popoff et al. | 365/189.01 |
| 2007/0158727 A1 | 7/2007 | Song et al. | |
| 2007/0285982 A1 | 12/2007 | Carman | |
| 2008/0130376 A1 | 6/2008 | Park et al. | |
| 2008/0278473 A1 | 11/2008 | An | |
| 2008/0284493 A1 | 11/2008 | Baek et al. | |

FOREIGN PATENT DOCUMENTS

| | | |
|---|---|---|
| JP | 2003-031696 | 1/2003 |
| JP | 2003-068877 | 3/2003 |
| JP | 2003-132682 | 5/2003 |
| JP | 2006085812 | 3/2006 |
| JP | 2006-107560 | 4/2006 |
| JP | 2006-156986 | 6/2006 |
| JP | 2006-179746 | 7/2006 |
| JP | 2006-260722 | 9/2006 |
| JP | 2007-018588 | 1/2007 |
| JP | 2007-036257 | 2/2007 |
| JP | 2007-073680 | 3/2007 |
| KR | 10-1994-0003406 | 2/1994 |
| KR | 100248507 | 12/1999 |
| KR | 1020020014757 A | 2/2002 |
| KR | 1020030015823 A | 2/2003 |
| KR | 100429868 | 4/2004 |
| KR | 1020050071665 A | 7/2005 |
| KR | 1020060104794 A | 10/2006 |
| KR | 100660910 B1 | 12/2006 |
| KR | 100673012 | 1/2007 |
| KR | 100682537 B1 | 2/2007 |
| KR | 100699890 B1 | 3/2007 |
| KR | 1020080047105 | 5/2008 |
| KR | 1020080058806 | 6/2008 |

OTHER PUBLICATIONS

Ota et al., "Novel Locally Strained Channel Technique for High Performance 5nm CMOS," IEEE 2002, pp. 27-30.

Cho et al., "A 6F2 DRAM Technology in 60nm era Gigabit Densities," 2005 Symposium on VLSI Technology Digest of Technical Papers, pp. 36-37.

Ohsawa et al., "A Memory Using One-Transistor Gain Cell on SOI(FBC) with Performance Suitable for Embedded DRAM's," 2003 Symposium on VLSI Circuits Digest of Technical Papers, pp. 93-96.

Jeong et al., "A Capacitor-less IT DRAM Cell Based on a Surrounding Gate MOSFET with a Vertical Channel," 2005 IEEE Silicon Nanoelectronics Workshop, pp. 92-93.

"Capacitor-less 1T DRAM cell structure for sensing margin and retention time enhancement," 2007 The Korean Conference on Semiconductors.

Oh et al., "Floating Body DRAM Characteristics of Silicon-On-ONO (SOONO) Devices for System-on-Chip (SoC) Applications," 2007 Symposium on VLSI Technology Digest of Technical Papers, pp. 168-169.

ISSCC 2005, Session 25, Dynamic Memory, "An 18.5ns 128Mb SOI DRAM with a Floating Body Cell," pp. 458-459, 609.

Non-Final Office Action dated Oct. 27, 2010, from U.S. Appl. No. 12/171,406, filed Jul. 11, 2008; Inventor Ki-Whan Song.

Takashi Ohsawa et al., Memory Design Using a One-Transistor Gain Cell on SOI; IEEE Journal of Solid-State Circuits, vol. 37, No. 11, Nov. 2002; pp. 1510-1522.

Ki-Whan Song et al., 55 nm Capacitor-less 1T DRAM Cell Transistor with Non-Overlap Structure.

Michel Bron et al., A 2ns Read Latency, 4MB Embedded Z-RAM Floating Body Memory Macro in 45nm SOI Technology.

U.S. Appl. No. 12/171,406, filed Jul. 11, 2008; Inventor—Ki-Whan Song et al.

U.S. Appl. No. 12/654,283, filed Dec. 16, 2009; Inventor—Ki-Whan Song et al.

U.S. Appl. No. 12/285,520, filed Oct. 8, 2008; Inventor—Jin-Young Kim.

Office Action dated Aug. 18, 2010 in U.S. Appl. No. 12/285,520.

* cited by examiner

SEMICONDUCTOR MEMORY DEVICE INCLUDING FLOATING BODY TRANSISTOR MEMORY CELL ARRAY AND METHOD OF OPERATING THE SAME

PRIORITY CLAIM

A claim of priority is made to Korean Patent Application No. 10-2008-0000826, filed Jan. 3, 2008, the contents of which are hereby incorporated herein by reference in their entirety.

SUMMARY

Example embodiments relate to a memory cell array, and more particularly, to a semiconductor memory device including a memory cell array having a floating body transistor, and to a method of operating the same.

U.S. Patent Application Publication No. 2007/0058427 discloses a memory cell array for writing and reading data utilizing a bipolar junction transistor operation. In particular, a bipolar current flowing between a drain and a source of a floating body transistor when reading data "1" is greater than when reading data "0". Sensing circuitry reads the data "1" and "0" by sensing such currents.

Since majority carriers accumulated in a floating body are lost over time, the dynamic memory cell using the floating body transistor should be refreshed to maintain stored data, in a manner similar to that of a dynamic memory cell.

According to one or more example embodiments, a semiconductor memory device includes a memory cell array including a plurality of memory cells, where each memory cell includes a transistor with a floating body region in which majority carriers are accumulated in a steady state. In write and read operations, a first data state corresponding to the steady state is written to and read from at least one selected memory cell of the memory cell array by supplying a first bipolar current through the at least one selected memory cell, and a second data state is written to and read from the at least one selected memory cell by supplying a second bipolar current which is smaller than the first bipolar current through the at least one selected memory cell. In a refresh operation, memory cells of the memory cell array storing the second data state are refreshed.

According to other example embodiments, a method of operating a semiconductor memory device is provided, where the memory device includes a memory cell array having a plurality of memory cells that are respectively connected between a plurality of word lines, a plurality of source lines, and a plurality of bit lines, and each have a transistor with a floating body where majority carriers are accumulated in a steady state. The method includes writing and reading, in write and read operations, a data "1" state as the steady state to and from at least one selected memory cell by making a first bipolar current flow through the at least one memory cell, and a data "0" state to and from the at least one selected memory cell by making a second bipolar current which is smaller than the first bipolar current flow through the at least one memory cell; and refreshing the at least one memory cell storing the data "0" in a refresh operation.

BRIEF DESCRIPTION OF THE DRAWINGS

Example embodiments are described in detail below with reference to the accompanying drawings. It should be understood that various aspects of the drawings may have been exaggerated for clarity. In the drawings.

DETAILED DESCRIPTION OF EMBODIMENTS

Figure 1:
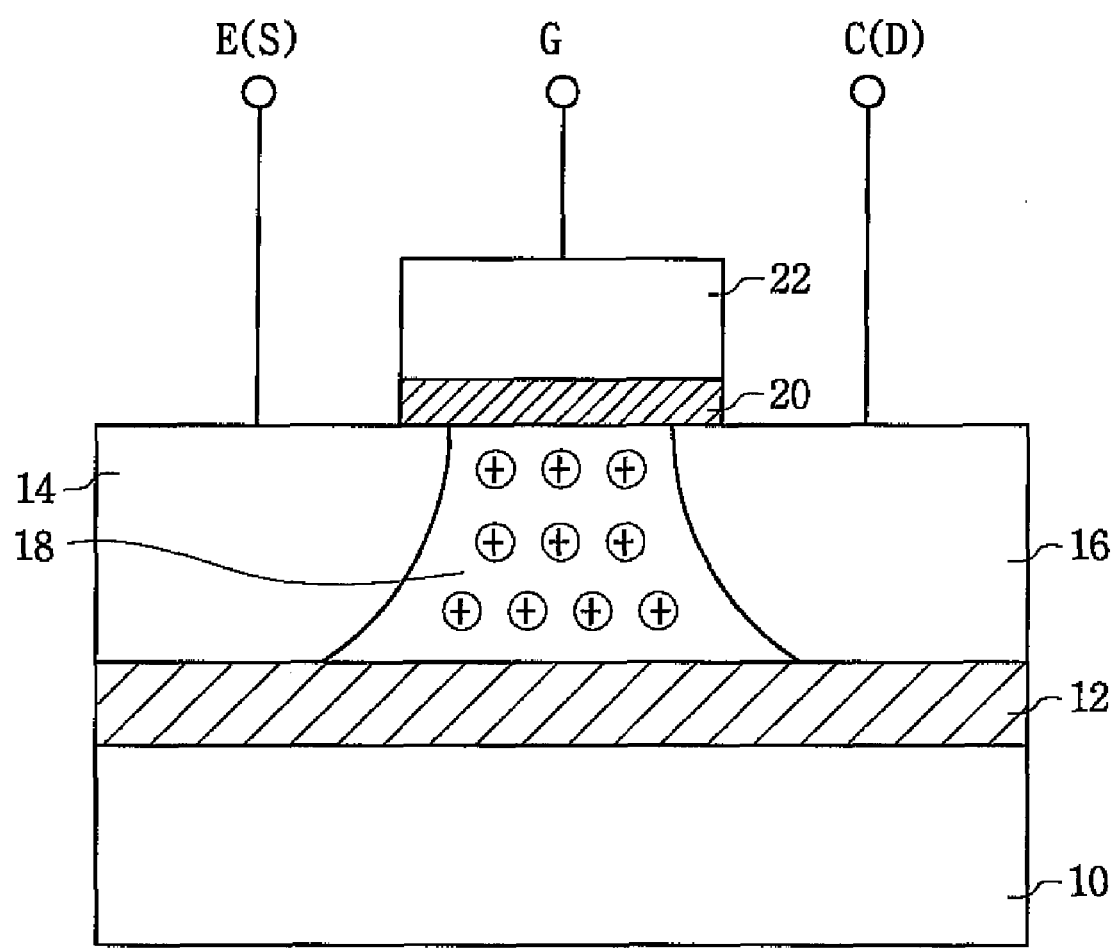
FIG. 1 illustrates the structure of a floating body transistor according to one or more example embodiments.

Various example embodiments will now be described more fully with reference to the accompanying drawings. In the drawings, the thicknesses of layers and regions may be exaggerated for clarity.

FIG. 1 shows a structure of a floating body transistor according to one or more example embodiments. The structure includes a substrate 10, an insulating layer 12 formed on the substrate 10, an n-type source region 14 and an n-type drain region 16, which are separated from each other and formed on the insulating layer 12, a p+-type floating body region 18 filled with holes as majority carriers between the source region 14 and the drain region 16, an insulating layer 20 formed on the floating body region 18, and a gate region 22 formed on the insulating layer 20.

In a steady state, the floating body transistor shown in FIG. 1 has, for example, a data "1" state in which the floating body region 18 is filled with holes as majority carriers. This is achieved by implementing a high doping concentration of the floating body region 18 in a manufacturing process.

Figure 2:
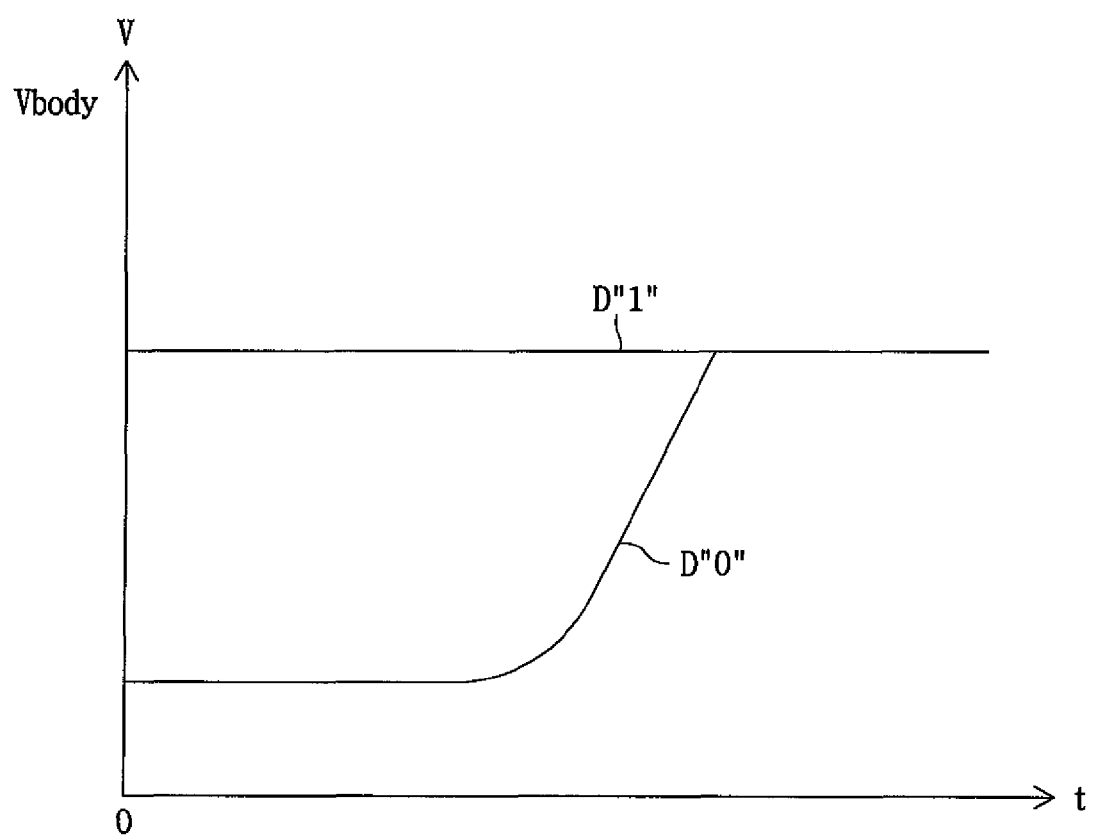
FIG. 2 is a graph of voltages Vbody of a floating body region versus time T in the floating body transistor of FIG. 1.

FIG. 2 illustrates voltages Vbody of the floating body region 18 versus time t in the floating body transistor of FIG. 1. The floating body transistor storing the data "1" (D "1") continuously maintains the steady state. When a predetermined time has elapsed, the floating body transistor storing the data "0" (D "0") returns to the steady state, that is, the data "1" state. The transition from the data "0" state to the data "1" state occurs since holes are thermally generated in the floating body region.

According to one or more example embodiments, the floating body transistor is manufactured in a state in which the steady state is the data "1" state in the manufacturing process. The majority carriers of the floating body region of the floating body transistor storing the data "1" are maintained without loss. On the other hand, the floating body region of the floating body transistor storing the data "0" is filled with the majority carriers.

According to one or more example embodiments, the refresh operation of the floating body transistor discharges the majority carriers filling the floating body region of the floating body transistor storing the data "0" without filling the floating body region of the floating body transistor storing the data "1" with the majority carriers. That is, the refresh operation of the floating body transistor may reduce current consumption by making a small bias current flow through the source and drain regions of the floating body transistor storing the data "0".

Figure 3:
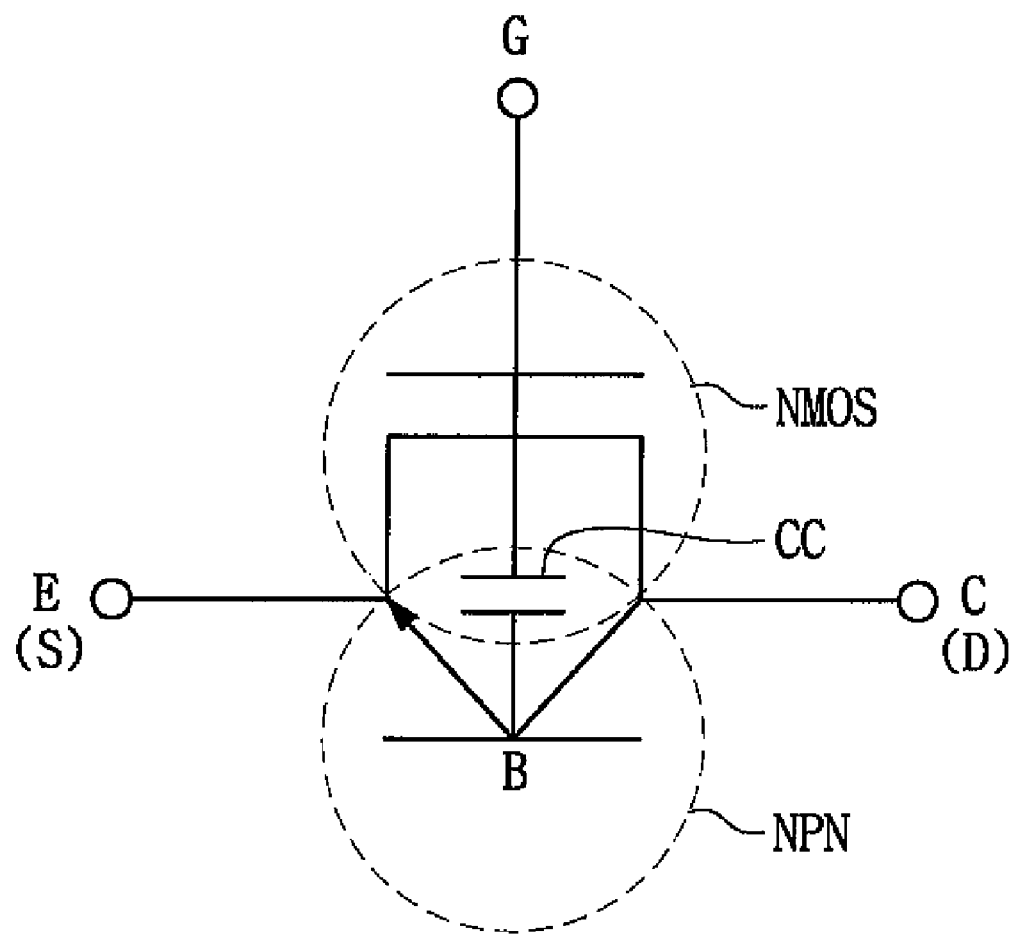
FIG. 3 is an equivalent circuit diagram of the structure of the floating body transistor of FIG. 1.

FIG. 3 is an equivalent circuit diagram of the floating body transistor shown in FIG. 1. The structure includes an n-type metal oxide semiconductor (NMOS) field effect transistor (hereinafter, referred to as an NMOS transistor) and an NPN bipolar junction transistor (hereinafter, referred to as an NPN transistor). A source S of the NMOS transistor and an emitter E of the NPN transistor are shared. A drain D of the NMOS transistor and a collector C of the NPN transistor are shared. A base B of the NPN transistor is electrically floated. A coupling capacitor (CC) is located between the base B and a gate G of the NMOS transistor.

Figure 4:
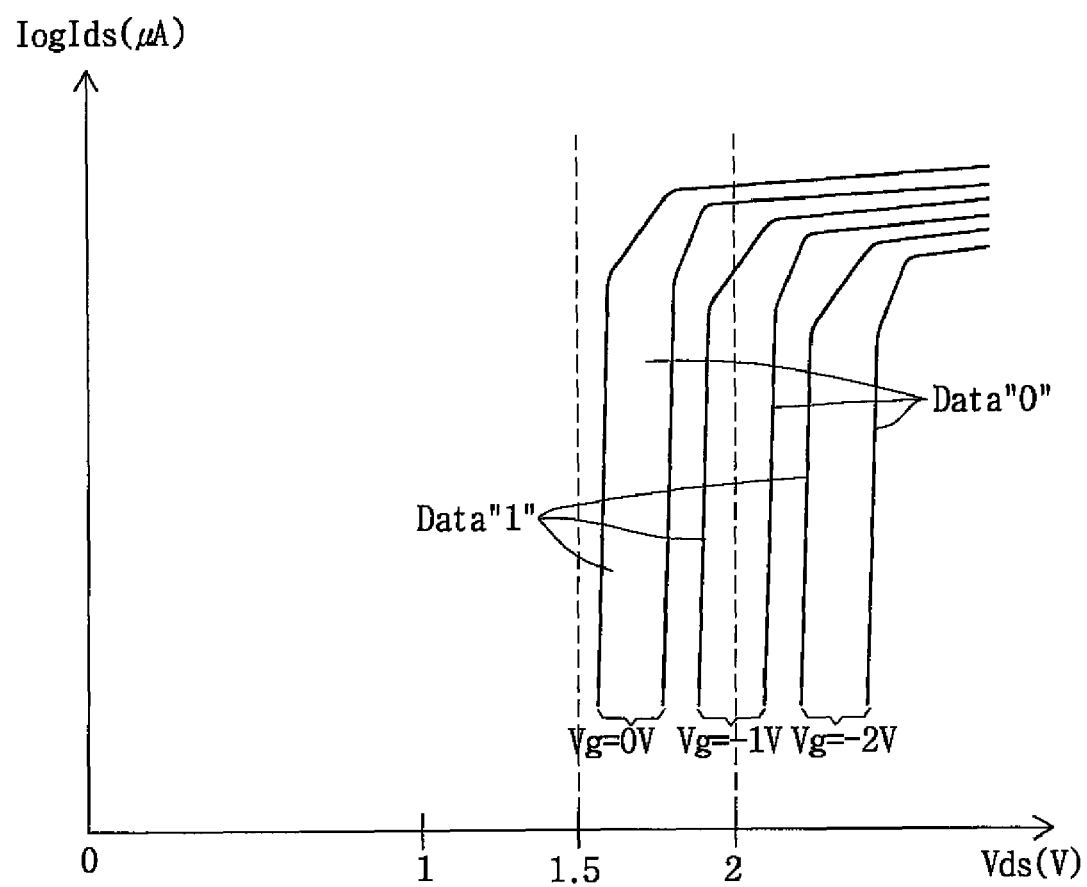
FIG. 4 is a graph showing direct current (DC) characteristics of the floating body transistor according to one or more example embodiments.

FIG. 4 is a graph showing DC characteristics of the floating body transistor according to one or more example embodiments. The graph shows variation of a current Ids between the drain and the source with a voltage Vds between the drain and the source of the transistor in the data "1" state and the data "0" state when a gate voltage Vg is 0V, −1V, and −2V.

In FIG. 4, the data "1" state is accompanied by a larger number of majority carriers (holes) in the floating body region 18 than the data "0" state. The data "0" state is accompanied by a smaller number of majority carriers in the floating body region 18 than the data "1" state.

From the graph of FIG. 4, it can be seen that when the gate voltage Vg is 0 V, a abrupt current increase occurs before the voltage Vds between the drain and the source reaches 2 V, that is, between 1.5 V and 2 V, regardless of the data "1" or "0" state of the floating body transistor. When the voltage Vds between the drain and the source is equal to or greater than a predetermined voltage between 1.5 V and 2 V, according to the abrupt current increase described above, holes are initially injected into the base B by drain coupling and the potential of the base region is increased. A forward voltage is applied between the base B and the emitter E causing an emitter current to flow. A large emitter current flows to the collector C and passes through a band bending region between the base B and the collector C, resulting in band-to-band tunneling and/or impact ionization. The holes are injected from the collector C to the base B by the band-to-band tunneling and/or impact ionization, thereby increasing the potential of the base B again. When the voltage Vds between the drain and the source increases and the NPN transistor is turned on, the bipolar current Ids is abruptly increased by a forward feedback system of the NPN transistor itself. When a multiplication factor is increased by the impact ionization, the bipolar current Ids may abruptly increase. The data "1" state is written by the bipolar current Ids. When the floating body transistor is in the data "1" state, the NPN transistor is turned on by a lower voltage than when the voltage Vds between the drain and the source is in the data "0" state, thereby increasing the bipolar current Ids. This is because the floating body potential itself is highly formed by the holes within the floating body region 18 and the NPN transistor is turned on by the band-to-band tunneling and/or impact ionization at higher speed than when the floating body transistor is in the data "0" state.

When the gate voltage Vg is −1 V in FIG. 4, the bipolar current abruptly increases at the voltage Vds between the drain and the source, which is higher than when the gate voltage Vg is 0 V. Since the electrostatic potential of the base decreases when the gate voltage Vg decreases, the voltage Vds between the drain and the source is to be increased to turn on the NPN transistor by the band-to-band tunneling and/or impact ionization.

Likewise, when the gate voltage Vg is −2 V in FIG. 4, the bipolar current abruptly increases at the voltage Vds between the drain and the source, for example, at least 2 V, which is higher than when the gate voltage Vg is −1 V. Since the electrostatic potential of the base decreases when the gate voltage Vg decreases, the voltage Vds between the drain and the source is to be increased to turn on the NPN transistor by the band-to-band tunneling and/or impact ionization. Accordingly, when the gate voltage Vg is −2 V and the voltage Vds between the drain and the source is lower than or equal to 2 V, all NPN transistors of memory cells storing the data "1" and "0" are turned off.

The floating body transistor is not limited to the structure of the example embodiments shown in FIG. 1, and may instead have other structures. Since the characteristics of FIG. 3 are provided when the structure has a floating body and a circuit configuration modeled in FIG. 3, any structure in which the floating body transistor has the circuit configuration modeled in FIG. 3 is possible.

Figure 5:
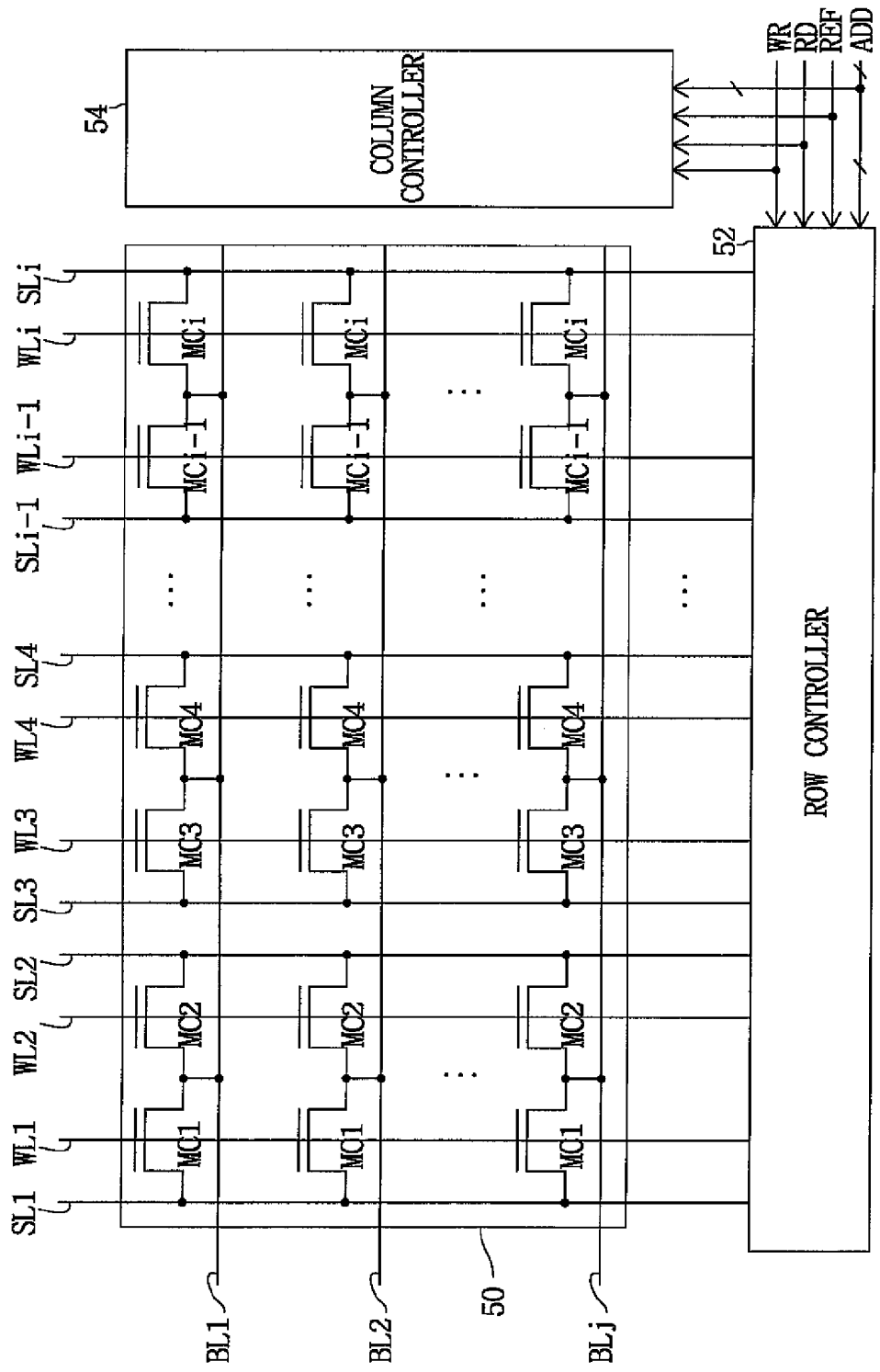
FIG. 5 shows a configuration of a memory cell array including the floating body transistor according to one or more example embodiments.

FIG. 5 shows a configuration of a semiconductor memory device according to one or more example embodiments. The semiconductor memory device includes a memory cell array 50, a row controller 52, and a column controller 54. The memory cell array 50 includes memory cells MC1, MC2, . . . , MC(i-1), MCi having gates connected to i word lines WL1, WL2, . . . , WL(i-1), WLi, drains connected to j bit lines BL1, BL2, . . . , BLj, sources connected to i source lines SL1, SL2, . . . , SL(i-1), SLi, and floating bodies. In FIG. 5, the row controller 52 and the column controller 54 may be configured in one controller.

The word lines WL1, WL2, . . . , WL(i-1), WLi and the source lines SL1, SL2, . . . , SL(i-1), SLi of the memory cell array 50 are arranged in the same direction. The bit lines BL1, BL2, . . . , BLj are arranged in a direction orthogonal to the word lines. The gates of the memory cells MC1, MC2, . . . , MC(i-1), MCi of the memory cell array 50 are connected to the word lines WL1, WL2, . . . , WL(i-1), WLi. The sources are connected to the source lines SL1, SL2, . . . , SL(i-1), SLi. The drains of two adjacent memory cells MC are commonly connected.

Referring to FIG. 5, the memory cell array 50 writes/reads the data "1" or "0" according to the bipolar current flowing through memory cells selected by one of the word lines WL1, WL2, . . . , WL(i-1), WLi, one of the source lines SL1, SL2, . . . , SL(i-1), SLi, and the bit lines BL1, BL2, . . . , BLj. In response to a write or read signal WR or RD and an address signal ADD, the row controller 52 selects the memory cells by controlling the word lines WL1, WL2, . . . , WL(i-1), WLi and the source lines SL1, SL2, . . . , SL(i-1), SLi. In response to a refresh command REF, the row controller 52 refreshes the memory cells by controlling the word lines WL1, WL2, . . . , WL(i-1), WLi. In response to the write or read signal WR or RD and the address signal ADD, the column controller 54 controls the bit lines BL1, BL2, . . . , BLj in order to disable data write and read operations for non-selected memory cells. The data "1" or "0" is read from/written to the memory cells selected by controlling the bit lines BL1, BL2, . . . , BLj. An address applied to the row controller 52 may be a row address, and an address applied to the column controller 54 may be a column address.

In FIG. 5, the refresh command REF is applied to initiate the refresh operation. However, the memory cells may instead be refreshed by internally counting a refresh period.

Figure 6:
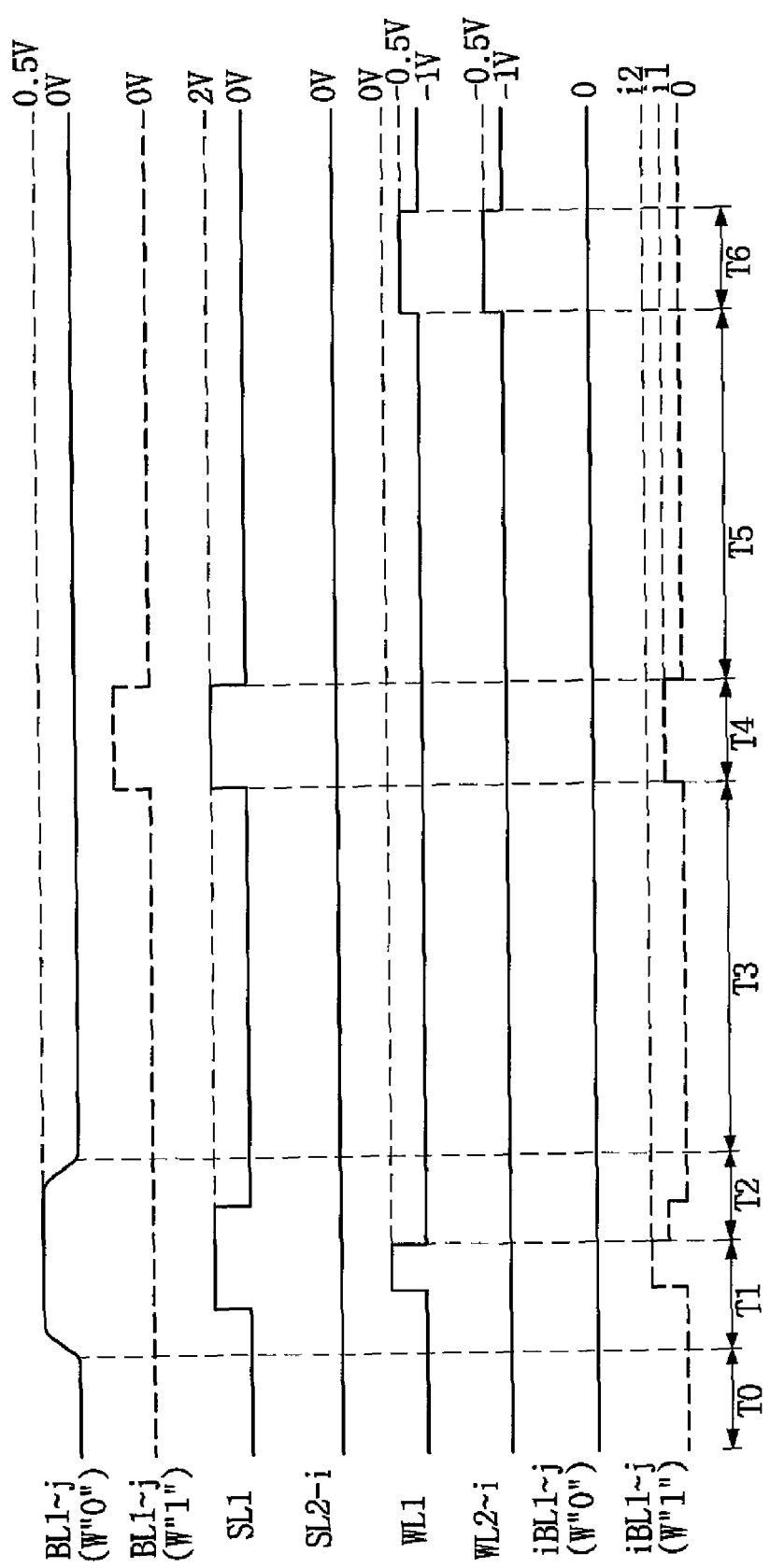
FIG. 6 is a timing diagram illustrating an operation of the memory cell array including the floating body transistor shown in FIG. 5 according to one or more example embodiments.

FIG. 6 is a timing diagram illustrating an operation of the semiconductor memory device shown in FIG. 5 according to one or more example embodiments. In the timing diagram of a voltage and current related to the bit lines, the solid line indicates writing of the data "0" and the dotted line indicates writing of the data "1". The timing diagram of FIG. 6 shows when the data write and read operations are performed for all memory cells connected to one selected word line.

Operations of the semiconductor memory device according to one or more example embodiments will be described below with reference to the timing diagram shown in FIG. 6.

First, an operation of writing the data "0" to the memory cells MC1 will be described.

In period T1, the column controller 54 applies a voltage of 0.5 V to the bit lines BL1~BLj, the row controller 52 applies a voltage of 2 V to the source line SL1 and a voltage of 0 V to the word line WL1. When the data "0" is stored in the memory cells MC1 in the period T0, the voltage Vds between the drain and the source of each memory cell MC1 becomes 1.5 V. The data "0" state is maintained according to whether or not a small number of holes are discharged from the floating body of each memory cell MC1. That is, as seen from the graph of FIG. 3, the NPN transistor is turned off and the bipolar current Ids does not substantially flow. When the data "1" is stored in the memory cells MC1 in period T0, the voltage of 0.5 V is applied to the bit lines BL1~BLj by the column controller 54, and the voltages of 2 V and 0 V are respectively applied to the source line SL1 and the word line WL1 by the row controller 52, the voltage Vds between the drain and the source of each memory cell MC1 becomes 1.5 V. Accordingly, since the band-to-band tunneling and/or impact ionization between the base and the collector of each memory cell MC1 are weakened, and the holes accumulated in the floating body are ejected through the emitter more than the holes injected into the floating body of each memory cell MC1, the data "0" is stored in the memory cells MC1. In the above-described method, the data "0" is written to the memory cells MC1. Times when voltages of the bit lines BL1~BLj, the source line SL1, and the word line WL1 rise may be sequential as shown in the timing diagram.

Next, an operation in which the data "1" is written to the memory cells MC1 will be described.

In period T1, the column controller 54 applies a voltage of 0 V to the bit lines BL1~BLj, and the row controller 52 applies a voltage of 2 V to the source line SL1 and a voltage of 0 V to the word line WL1. In the period T0, the voltage Vds between the drain and the source of each memory cell MC1 becomes 2 V when the data "0" is stored in the memory cells MC1. Accordingly, since the band-to-band tunneling and/or impact ionization between the base and the collector of each memory cell MC1 are activated, an increased number of holes are injected into the floating body. Then, the NPN transistor is turned on, the bipolar current i2 flows, and the data "1" is written to the memory cells MC1. On the other hand, when the data "1" is stored in the memory cells MC1 in the period T0, the column controller 54 applies a voltage of 0 V to the bit lines BL1~BLj, and the row controller 52 applies a voltage of 2 V to the source line SL1 and a voltage of 0 V to the word line WL1, the voltage Vds between the drain and the source of each memory cell MC1 becomes 2 V. Accordingly, since the band-to-band tunneling and/or impact ionization between the base and the collector of each memory cell MC1 are activated, the data "1" is written. Time points when voltages of the bit lines BL1~BLj, the source line SL1, and the word line WL1 rise may be sequential as shown in the timing diagram.

In period T2, the impact ionization is maintained when the row controller 52 applies a voltage of −1 V to the word line WL1 and a voltage of 2 V to the source line SL1, and the column controller 54 applies a voltage of 0 V to the bit lines BLi~BLj, such that the holes may be continuously injected into the base. Time points when voltages of the word line WL1, the source line SL1, and the bit line BL1 fall may be sequential as shown in the timing diagram. When the voltage of the source line SL1 first falls to 0 V in the period T2, the holes injected into the floating body are ejected through the emitter, such that the data "1" written to the memory cells MC1 may not be maintained. The period T2 is required to write the data "1". The data "0" may be written in period T3 without being written in the period T2. However since only the data "1" or "0" is not written to the memory cell array, active times of the bit lines, the source lines, and the word lines may be controlled in synchronization with the data "1" write operation. The bipolar current i1 flowing through the memory cells MC1 in the period T2 is smaller than the bipolar current i2 in the period T1.

In the period T3, the electrostatic potential of the floating body of each memory cell MC1 is lowered when the column controller 54 applies a voltage of 0 V to the bit lines BL1~BLj, and the row controller 52 applies a voltage of 0 V to the source line SL1 and a voltage of −1 V to the word line WL1. Accordingly, the NPN transistor is turned off, such that the holes accumulated in the floating body may be maintained.

In period T4, the voltage Vds between the drain and the source of each memory cell MC1 becomes 2 V when the row controller 52 applies a voltage of −1 V to the word line WL1 and a voltage of 2 V to the source line SL1, and the column controller 54 applies a voltage of 0 V to the bit lines BL1~BLj. When the data "1" is stored in the memory cells MC1, the NPN transistor is turned on and the bipolar current i1 flows. When the data "0" is stored in the memory cells MC1, the NPN transistor is turned off and the bipolar current Ids does not flow. The bipolar current i1 flowing through the memory cells MC1 in the time T4 is smaller than the bipolar current i2 in the period T1. In the above-described method, the data "1" and "0" are read. In the period T4, a restore operation is performed on data stored in the memory cells.

In period T5, like the period T3, the same data retention operation is performed.

As shown in the timing diagram, in period T6, the row controller 52 simultaneously applies a voltage between 0 V and −1 V to all the word lines WL1~WLi, or sequentially applies the voltage between 0 V and −1 V to at least one word line, when the refresh time is reached or the refresh command REF is applied. Accordingly, all memory cells of the memory cell array are simultaneously refreshed, or all memory cells connected to at least one word line are sequentially refreshed. That is, when a very low voltage between 0 V and −1 V is applied to the word line, the potential of the floating body region is increased by gate coupling of the memory cells storing the data "0", thereby discharging majority carriers accumulated in the floating body area and preventing majority carriers from being accumulated. At this time, the source and bit lines of the memory cells of the memory cell array are maintained at 0 V. In other words, the memory cells storing the data "0" are refreshed before the memory cells storing the data "0" in the memory cell array changes to the data "1" state as the steady state. At this time, the memory cells storing the data "1" connected to the same word line are not affected, thereby maintaining the data "1".

In an operational method of the semiconductor memory device according to one or more example embodiments, the memory cells storing the data "0" are refreshed by applying a very low voltage to the word lines thereof Since a very small bipolar current flows through the memory cells storing the data "0", current consumption of the refresh operation is reduced. Since memory cells connected to at least two word lines may be simultaneously refreshed, a time taken for the refresh operation may be reduced. Since all memory cells connected to all word lines within the memory cell array may be simultaneously refreshed, a time taken for the refresh operation may be minimized.

Figure 7:
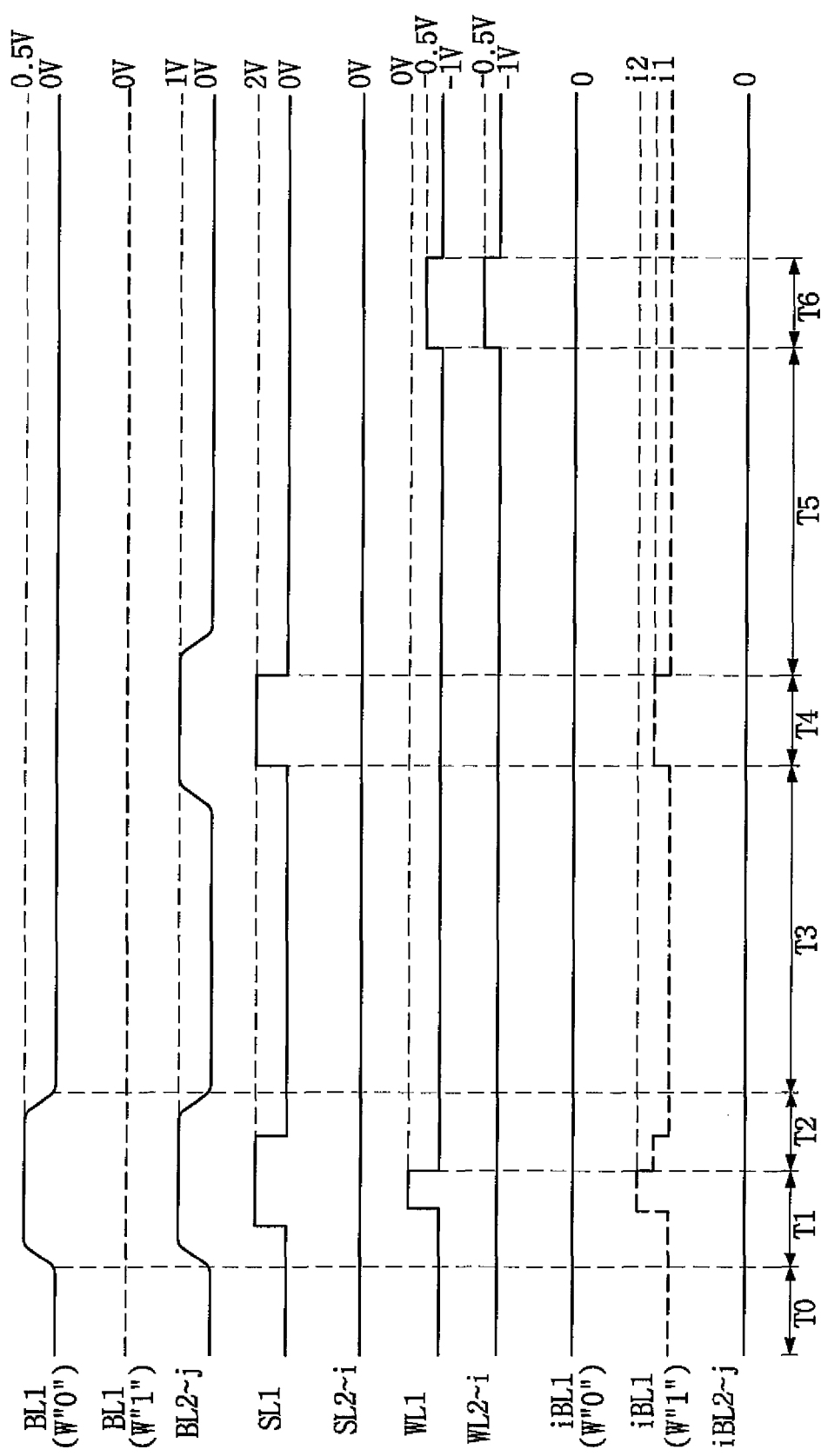
FIG. 7 is a timing diagram illustrating an operation of the memory cell array including the floating body transistor shown in FIG. 5 according to other example embodiments.

FIG. 7 is a timing diagram illustrating an operation of the memory cell array having the floating body transistor shown in FIG. 5 according to other example embodiments. In the timing diagram of a voltage and current related to the bit lines, the solid line indicates writing of the data "0" and the dotted line indicates writing of the data "1". The timing diagram of FIG. 7 shows when data write and read operations are performed for one memory cell connected between a selected word line and a selected source line.

With reference to the timing diagram shown in FIG. 7, an operation of the memory cell array according to one or more example embodiments will be described as follows.

Referring to the description related to FIG. 6, operations in periods T0 and T1 will be readily understood. In the period T1, a difference is that the column controller 54 applies a voltage of 1 V to the bit lines BL2~BLj in order to prevent the data write operation for the memory cells MC1 connected to the bit lines BL2~BLj. Since the voltage Vds between the drain and the source of each of the memory cells MC1 connected to the bit lines BL2~BLj becomes 1 V, and a voltage of 0 V is applied to the word line WL1, an operation of writing the data "1" and "0" to the memory cells MC1 connected to the bit lines BL2~BLj is prevented. That is, since a forward voltage of the NPN transistor is insufficient when the data "1" is stored in the memory cells MC1 connected to the bit lines BL2~BLj, the holes accumulated in the floating body are not ejected, thereby preventing the data "0" from being written. When the data "0" is written, the holes are not injected, thereby preventing the data "1" from being written.

Referring to the description related to FIG. 6, an operation of maintaining the data "1" stored in the memory cell MC1 connected to the word line WL1, the source line SL1, and the bit line BL1 in period T2, and an operation of maintaining the data "0" and "1" stored in the memory cell MC1 connected to the word line WL1, the source line SL1, and the bit line BL1 in period T3, will be readily understood.

Referring to the description related to FIG. 6, an operation of reading the data "0" and "1" from the memory cell MC1 connected to the word line WL1, the source line SL1, and the bit line BL1 in period T4 will be readily understood. In this regard, a difference is that the column controller 54 applies a voltage of 1 V to the bit lines BL2~BLj in order to prevent data from being written to the memory cells MC1 connected to the bit lines BL2~BLj. A period in which the voltage of 1 V is applied to the bit lines BL2~BLj may be set from a time before a voltage of 2 V is applied to the source line SL1 to a time after the voltage of 2 V is completely applied to the source line SL1. Referring to the description about the prevention of writing the data "0" and "1" in the period T1, the prevention of reading the data "0" and "1" from the memory cells MC1 connected to the bit lines BL2~BLj in the period T4 will be readily understood. In the period T4, data may be read by sensing a bit line current or voltage.

Referring to the description related to FIG. 5, operations in periods T5 and T6 will be readily understood.

The semiconductor memory device shown in FIG. 5, and its operation shown in FIGS. 6 and 7, utilize characteristics when the gate voltage Vg of the characteristic graph of FIG. 4 is 0 V and −1 V.

Figure 8:
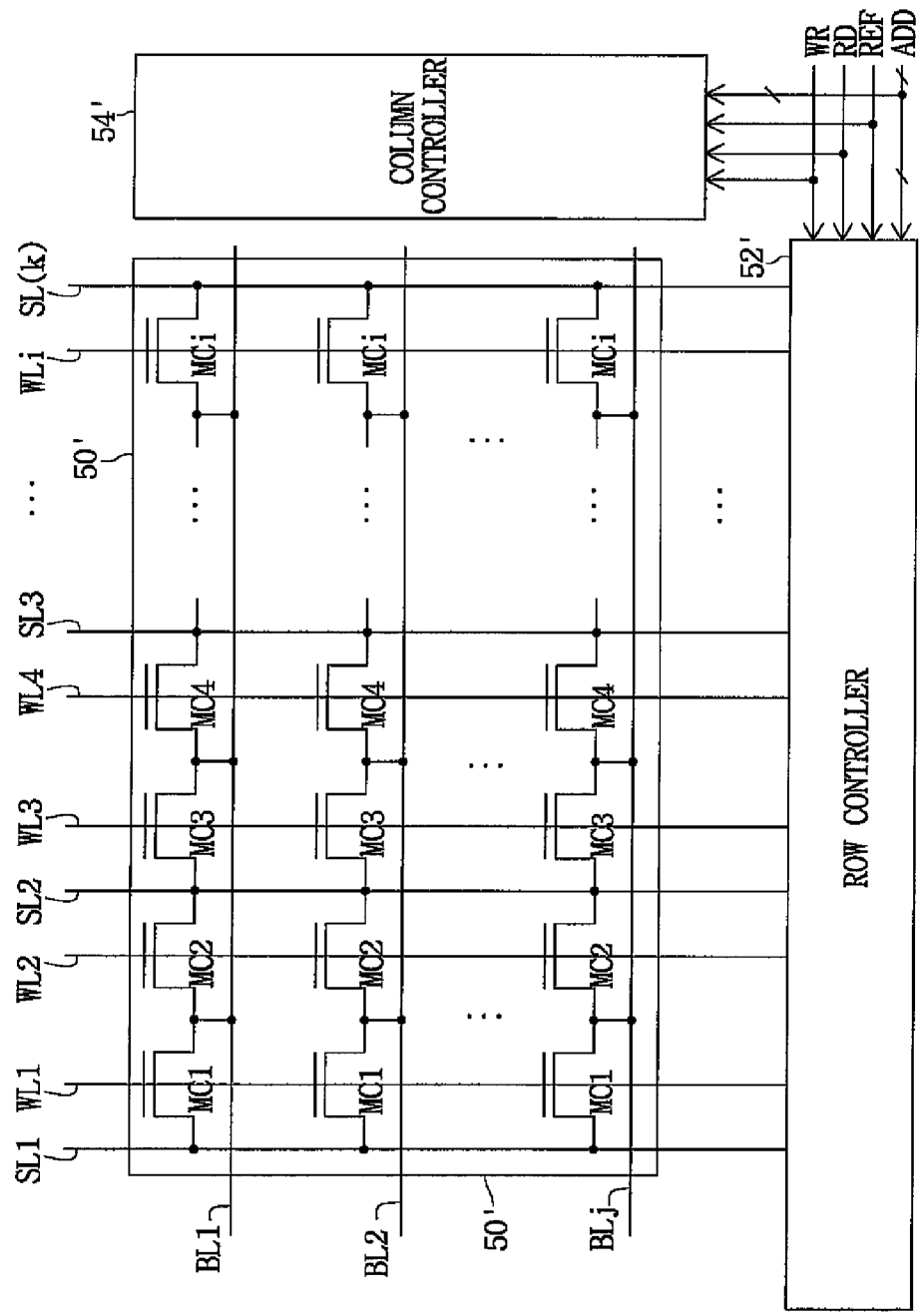
FIG. 8 shows a configuration of the memory cell array having the floating body transistor according to other example embodiments.

FIG. 8 shows a configuration of a semiconductor memory device according to other example embodiments. The semiconductor memory device includes a memory cell array 50', a row controller 52', and a column controller 54'. The memory cell array 50' includes memory cells MC1, MC2, ..., MC(i-1), MC1 having gates connected to i word lines WL1, WL2, ..., WL(i-1), WLi, drains connected to j bit lines BL1, BL2, ..., BLj, sources connected to k source lines SL1, SL2, ..., SL(k-1), SLk, and floating bodies.

In FIG. 8, the i word lines WL1, WL2, ..., WL(i-1), WLi and the k source lines SL1, SL2, ..., SL(k-1), SLk of the memory cell array 50' are arranged in the same direction. The j bit lines BL1, BL2, ..., BLj are arranged in a direction orthogonal to the word lines. The drains of two adjacent memory cells MC are commonly connected to a corresponding bit line. The sources of two adjacent memory cells MC are commonly connected to a corresponding source line. Accordingly, when the number of word lines is i, the number of source lines k is half the number of word lines.

Since the number of source lines is less than the number of word lines in the memory cell array shown in FIG. 8, line arrangement is more easily facilitated than in the memory cell array shown in FIG. 5.

Since functions of the memory cell array 50', the row controller 52', and the column controller 54' shown in FIG. 8 are similar to those of the memory cell array 50, the row controller 52, and the column controller 54 shown in FIG. 5, they may be readily understood by referring to the functions described with reference to FIG. 5.

Figure 9:
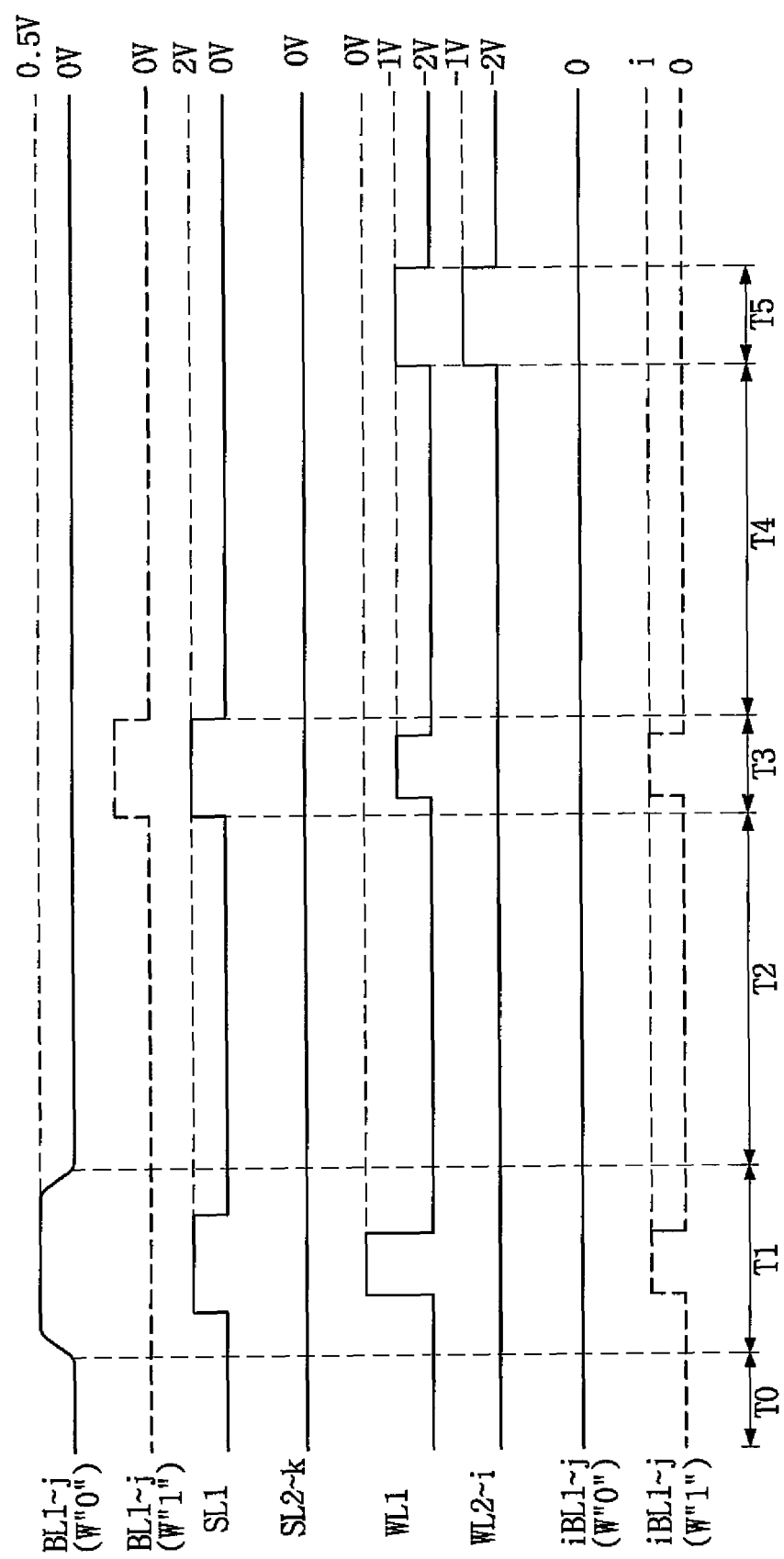
FIG. 9 is a timing diagram illustrating an operation of the memory cell array having the floating body transistor shown in FIG. 8 according to one or more example embodiments.

FIG. 9 is a timing diagram illustrating an operation of the semiconductor memory device shown in FIG. 8 according to one or more example embodiments. In the timing diagram of a voltage and current related to the bit lines, the solid line indicates writing of the data "0" and the dotted line indicates writing of the data "1". The timing diagram of FIG. 9 shows when data write and read operations are performed for all memory cells connected to one selected word line.

Operations of the semiconductor memory device according to one or more example embodiments will be described with reference the timing diagram shown in FIG. 9.

In the timing diagram shown in FIG. 9, which is different from that shown in FIG. 6, a voltage of 0 V is applied to a word line in period T1 and a voltage of −2 V is applied to a word line in periods T0, T2, and T4. This is because a source line is shared between adjacent memory cells without respectively connecting source lines to the adjacent memory cells. Unlike the semiconductor memory device of FIG. 5, a voltage of −2 V, which is lower than −1 V, is applied to a word line of non-selected memory cells in order to turn off all NPN transistors of the non-selected memory cells in the write and read operations for selected memory cells. From the characteristic graph of FIG. 4, it may be seen that all memory cells storing the data "1" and "0" are turned off when the gate voltage Vg is −2 V.

Operations in the periods T0 and T1 of FIG. 9 are the same as in the periods T0 and T1 of FIG. 6, and operations in the periods T2, T3, and T4 of FIG. 9 are the same as in the periods T3, T4, and T5 of FIG. 6. In the period T5, the memory cells storing the data "0" are refreshed by applying a voltage between 0 V and −2 V to the word line. At this time, the memory cells storing the data "1" connected to the same word line maintain the data "1" state without any influence.

Figure 10:
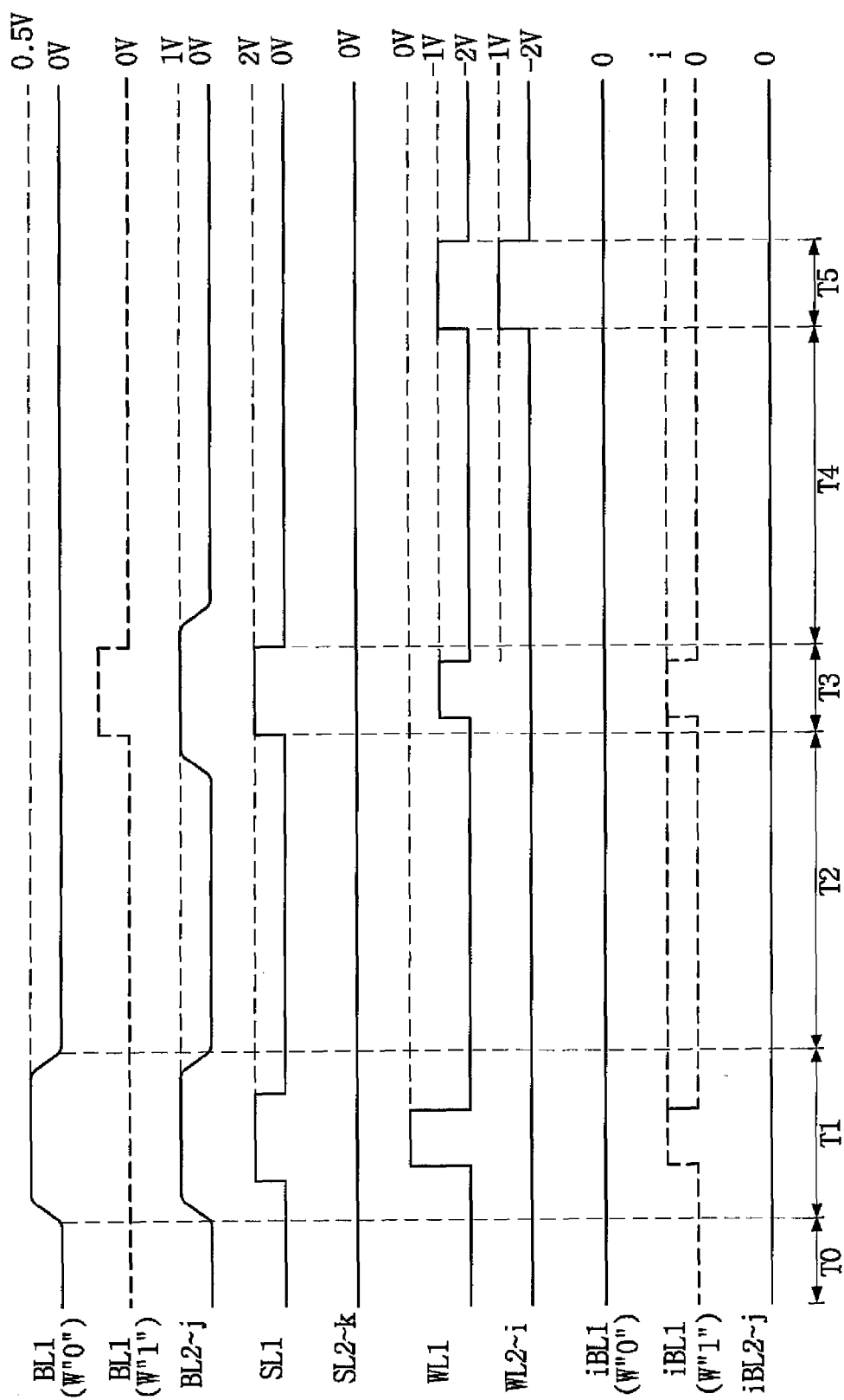
FIG. 10 is a timing diagram illustrating an operation of the memory cell array having the floating body transistor shown in FIG. 8 according to other example embodiments.

FIG. 10 is a timing diagram illustrating an operation of the semiconductor memory device shown in FIG. 8 according to other example embodiments. In the timing diagram of a voltage and current related to the bit lines, the solid line indicates writing of the data "0" and the dotted line indicates writing of the data "1". The timing diagram of FIG. 10 shows when data write and read operations are performed for one memory cell connected between a selected word line and a selected source line.

Using the timing diagram shown in FIG. 10, an operation of the semiconductor memory device according to one or more example embodiments will be described as follows.

In the timing diagram shown in FIG. 10, which different from that shown in FIG. 7, a voltage of 0 V is applied to a word line in period T1, and a voltage of −2 V is applied to the word line in periods T0 and T2. This is because a source line is shared between adjacent memory cells without respectively connecting source lines to the adjacent memory cells. Unlike the semiconductor memory device of FIG. 5, a voltage of −2 V, which is lower than −1 V, is applied to a word line of non-selected memory cells in order to turn off all NPN transistors of the non-selected memory cells in the write and read operations for selected memory cells. From the characteristic graph of FIG. 4, it can be seen that all memory cells storing the data "1" and "0" are turned off when the gate voltage Vg is −2 V.

Operations in periods T0 and T1 of FIG. 10 are the same as in the periods T0 and T1 of FIG. 7, and operations in periods T2, T3, and T4 of FIG. 10 are the same as in the periods T3, T4, and T5 of FIG. 7. As in the timing diagram of FIG. 9, in period T5, the memory cells storing the data "0" are refreshed by applying a voltage between 0 V and −2 V to the word line. At this time, the memory cells storing the data "1" connected to the same word line maintain the data "1" state without any influence.

The semiconductor memory device shown in FIG. 8, and its operation shown in FIGS. 9 and 10, utilize characteristics when the gate voltage Vg of the characteristic graph of FIG. 4 is 0 V, −1 V, and −2 V.

Although not shown, the row controller 52 of the semiconductor memory device shown in FIG. 8 may perform the refresh operation by applying a voltage between 0 V and −2 V to the word lines in response to the refresh command REF. In response to the refresh command REF, all the memory cells may be refreshed by applying a voltage between 0 V and −2 V to all the word lines WL1~WL1, or sequentially applying a voltage between 0 V and −2 V to at least two word lines.

All memory cells may be refreshed by sequentially applying a voltage between 0 V and −2 V to at least one word line of the semiconductor memory device shown in FIG. 8.

Although not shown, the semiconductor memory device shown in FIGS. 5 and 8 may include a sense amplification unit for sensing a bit line current or voltage. Since an operation according to the timing diagram of FIGS. 7 and 10 is possible, the semiconductor memory device shown in FIGS. 5 and 8 may read/write data from/to memory cells connected to one selected bit line. Accordingly, a plurality of bit lines or a predetermined number of bit lines may share one sense amplification unit (not shown).

Figure 11:
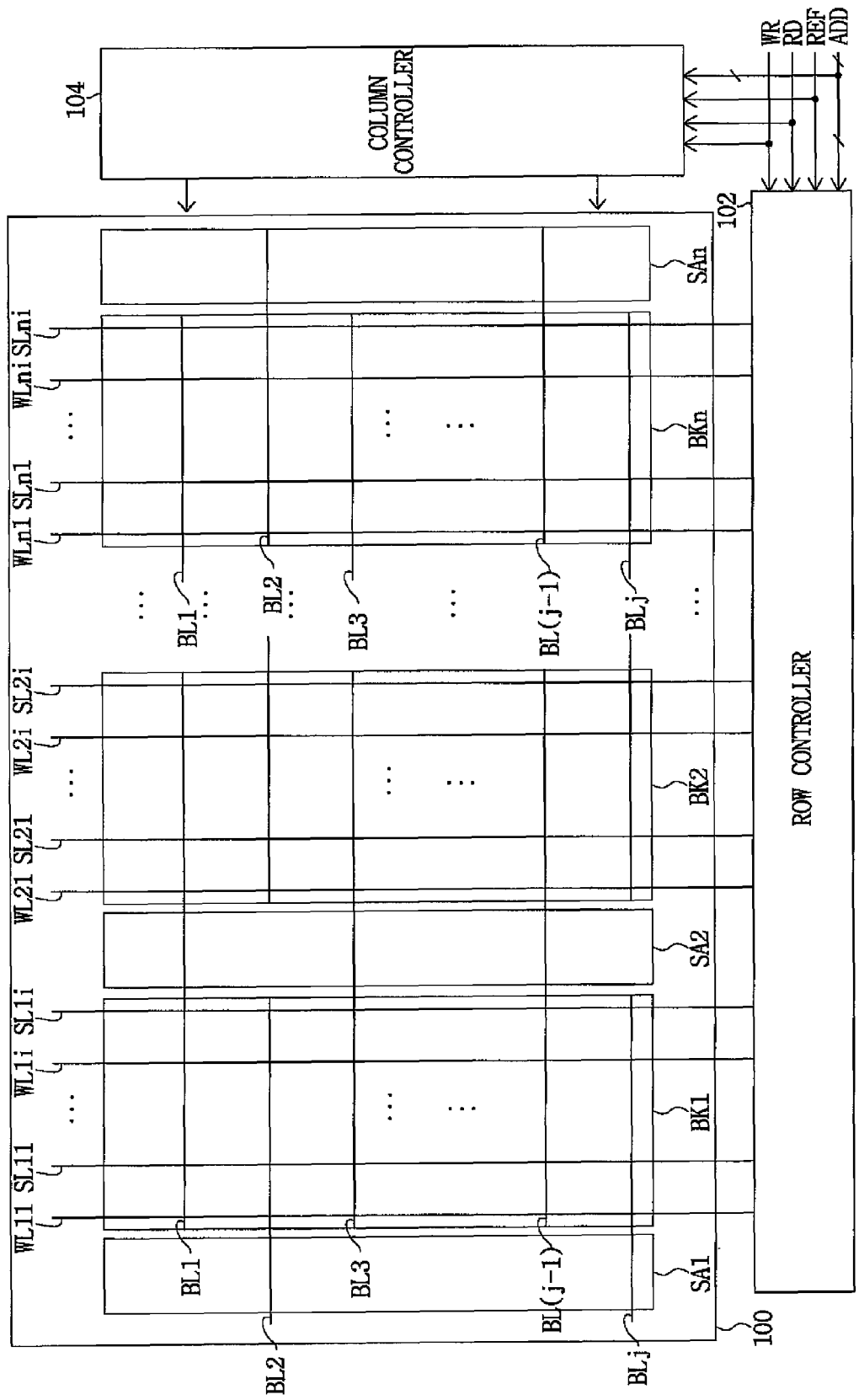
FIG. 11 shows a configuration of the memory cell array having the floating body transistor according to still other example embodiments.

FIG. 11 is a block diagram showing a configuration of a semiconductor memory device according to still other example embodiments. The semiconductor memory device may include a memory cell array 100, a row controller 102, and a column controller 104. The memory cell array 100 includes memory cell array blocks BK1~BKn and sensing blocks SA1, SA2, . . . , SAn. Each of the memory cell array blocks BK1~BKn may have a configuration shown in FIG. 5 or 8.

Referring to FIG. 11, the memory cell array 100 reads/writes data from/to at least one selected memory cell array block. In response to a write or read signal WR or RD, and an address signal ADD, the row controller 102 selects memory cells by controlling word lines WL11~WLni and source lines SL11~SLni. In response to a refresh command REF, the memory cells are refreshed by controlling the word lines WL11~WLni. At this time, all the memory cells may be refreshed by controlling the word lines WL11~WLni, controlling word lines in units of memory cell array blocks, or sequentially controlling at least one word line and sequentially refreshing memory cells connected to the at least one word line. In response to the write or read signal WR or RD and the address signal ADD, the column controller 104 controls the bit lines BL1~BLj in order to disable data write and read operations for non-selected memory cells. The data "1" or "0" is read from/written to the memory cells selected by controlling the bit lines BL1~BLj. An address applied to the row controller 102 may be a row address, and an address applied to the column controller 104 may be a column address. Each of the sensing blocks SA1~SAn applies a voltage corresponding to a data state to a corresponding bit line, or amplifies and outputs data of the bit line. Each of the sensing blocks SA1~SAn amplifies a current or voltage difference between bit lines by including a current or voltage sense amplifier.

Figure 12:
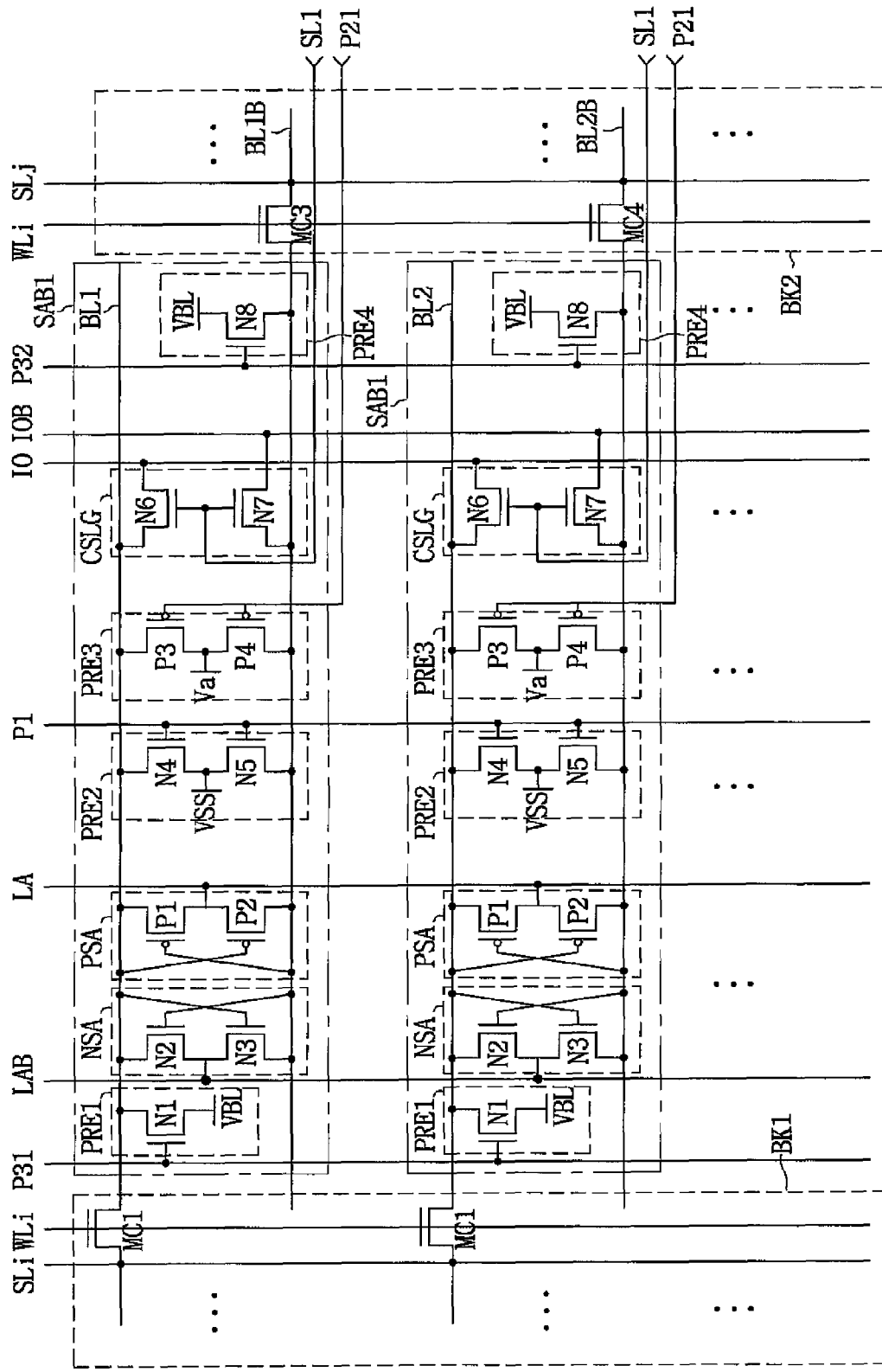
FIG. 12 shows a configuration of a sensing block shown in FIG. 11 according to one or more example embodiments.

FIG. 12 shows a configuration of a sensing block shown in FIG. 11 according to one or more example embodiments. The sensing block includes sense amplification units SAB1, SAB2, etc. Each of the sense amplification units SAB1, SAB2, etc. includes an NMOS sense amplifier NSA, a p-type metal oxide semiconductor (PMOS) sense amplifier PAS, a column selection gate CSLG, and precharge circuits PRE1, PRE2, PRE3, and PRE4. The NMOS sense amplifier NSA includes NMOS transistors N2 and N3. The PMOS sense amplifier PSA includes PMOS transistors P1 and P2. The column selection gate CSLG includes NMOS transistors N6 and N7. The precharge circuit PRE1 includes an NMOS transistor N1. The precharge circuit PRE2 includes NMOS transistors N4 and N5. The precharge circuit PRE3 includes PMOS transistors P3 and P4. The precharge circuit PRE4 includes an NMOS transistor N8.

In FIG. 11, WL1 and SLi denote representative word and source lines of the memory cell array block BK1. WLj and SLj denote representative word and source lines of the memory cell array block BK2.

In response to high-level precharge control signals P31 and P32, the precharge circuits PRE1 and PRE4 turn on the NMOS transistors N1 and N8 and precharge bit lines BL1, BL1B, BL2, BL2B, etc. to a reference voltage VBL. The reference voltage VBL may be set to a voltage of about ((V0+V1)/2) between a voltage V0 (about 0V) of the bit line when the data "0" is read and a voltage V1 when the data "1" is read. In response to a row address, the precharge control signals P31 and P32 are controlled according to a word line of a block selected between the memory cell array blocks BK1 and BK2. The precharge control signals P31 and P32 may be controlled by the row controller of FIGS. 5 and 8. In response to a high-level precharge control signal P1, the precharge circuit PRE2 turns on the NMOS transistors N4 and N5 and precharges the bit lines BL1, BL1B, BL2, BL2B, etc. to a ground voltage Vss. In response to low-level precharge control signals P21, P22, etc., the precharge circuit PRE3 turns on the PMOS transistors P3 and P4 and precharges the bit lines BL1, BL1B, BL2, BL2B, etc. to an internal power supply voltage Va. When a sense amplifier control signal LAB of the ground voltage level is applied and a voltage difference is generated between the bit lines BL1 and BL1B, BL2 and BL2B, etc., the NMOS sense amplifier NSA senses the voltage difference and sets low-level data of the bit lines BL1 and BL1B, BL2 and BL2B, etc. to the ground voltage level. When a sense amplifier control signal LA of the level of the internal power supply voltage Va is applied and a voltage difference is generated between the bit lines BL1 and BL1B, BL2 and BL2B, etc., the NMOS sense amplifier NSA senses the voltage difference and sets high-level data of the bit lines BL1 or BL1B, BL2 or BL2B, etc. to the level of the internal power supply voltage Va. In response to high-level column selection signals CSL1, CSL2, etc., the column selection gate CSLG is turned on and transfers data between a pair of input and output lines IO and IOB and the bit lines (BL1, BL1B), (BL2, BL2B), etc. When word lines of the memory cell array blocks BK1 and BK2 are selected in response to a row address, the sense amplifier control signals LA and LAB are controlled to be enabled. The sense amplifier control signals LA and LAB may be controlled by the row controller of FIGS. 5 and 8 of the above-described example embodiments. In response to a column address, the column selection signals CSL1, CSL2, etc., and the precharge control signals P21, P22, etc., are controlled. The column selection signals CSL1, CSL2, etc. may be controlled by the column controller of FIGS. 5 and 8 of the above-described example embodiments.

In the example embodiments shown in FIG. 12, the memory cells of the memory cell array blocks BK1 and BK2 have a connection as shown in FIG. 5 or 8, and a sensing block configuration of the memory cell array of the semiconductor memory device has an open bit line structure.

Figure 13:
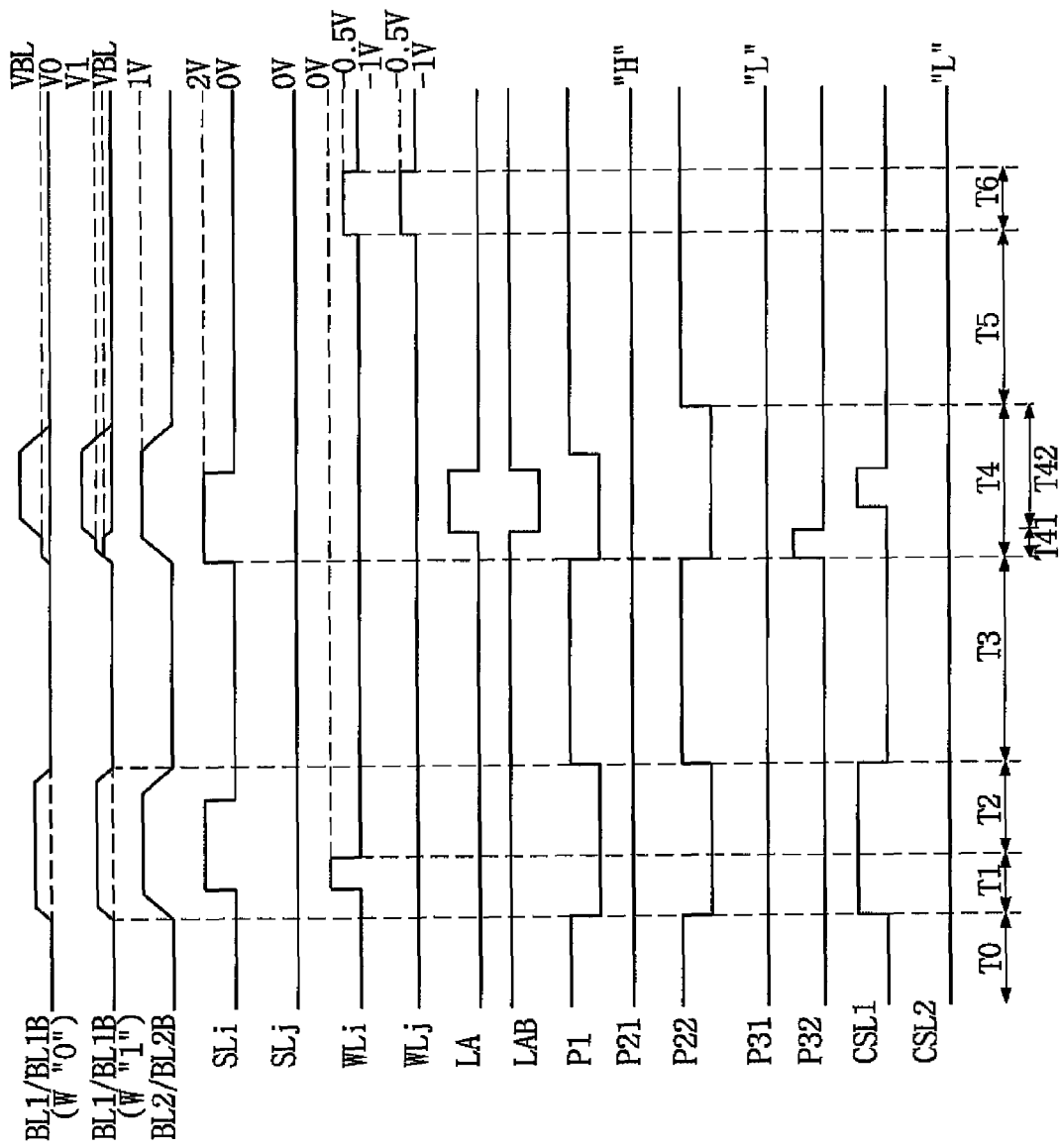
FIG. 13 is a timing diagram illustrating an operation of the sensing block shown in FIG. 12.

FIG. 13 is a timing diagram illustrating an operation of the sensing block shown in FIG. 12. Specifically, FIG. 13 is a timing diagram for when data write and read operations are performed for one memory cell connected between a selected word line and a selected source line, as a timing diagram when data is read from/written to a memory cell MC1.

In period T0, in response to high-level precharge control signals P1, P21, P22, etc., and low-level precharge control signals P31 and P32, the NMOS transistors N4 and N5 are turned on and the NMOS transistors N1 and N8 and the PMOS transistors P3 and P4 are turned off, such that the bit lines BL1, BL1B, BL2, BL2B, etc. may be precharged to the ground voltage VSS (0 V). That is, an operation as shown in the period T0 of FIG. 7 or 10 is performed.

In period T1, in response to low-level precharge control signals P1, P22, . . . , P31, P32, and high-level precharge control signals P21, etc., the PMOS transistors P3 and P4 and the NMOS transistors N1, N4, N5, and N8 of the sense amplification unit SAB1 are turned off, the PMOS transistors P3 and P4 of the sense amplifiers SAB2, etc. are turned on, and the NMOS transistors N1, N4, N5, and N8 of the sense amplifiers SAB2 are turned off, such that the bit lines BL2, BL2B, etc. may be maintained at the internal power supply voltage Va (about 1 V). When the NMOS transistors N6 and N7 of the sense amplification unit SAB1 are turned on in response to a high-level column selection signal CSL1, and the NMOS transistors N6 and N7 of the sense amplification unit SAB2 are turned off in response to a low-level column selection signal CSL2, data transferred through the pair of data input and output lines IO and IOB are transferred to the pair of bit lines BL1 and BL1B. Here, when the sense amplifier control signals LA and LAB respectively having the ground voltage level and the internal power supply voltage level are applied, both the PMOS sense amplifier PSA and the NMOS sense amplifier NSA are disabled. Signals to be applied to the source lines SLi and SLj and the word lines WLi and WLj are the same as in the period T1 of FIG. 7 or 10. Referring to the description related to FIG. 7, an operation in which data is written to the memory cell MC1 will be readily understood. When a voltage of 0 V is transferred to the bit line BL1, the data "1" is written. When a voltage of 0.5 V is applied, the data "0" is written. Here, since the bit lines BL2, BL2B, etc. are maintained at the level of the internal power supply voltage Va, an operation of writing data to memory cells connected to the lines WLi, SLi, BL2, BL2B, etc. is prevented. Referring to the description related to FIG. 7, this operation will be readily understood.

Referring to the description related to FIG. 7, an operation in period T2 will be readily understood. Here, the precharge control signals P1, P21, P22, . . . , P31, P32, the sense amplifier control signals LA and LAB, and the column selection signal CSL1 are maintained at the levels of the period T1.

The operation in period T3 is the same as in period T0 and precharges the bit lines BL1, BL1B, BL2, BL2B, etc. to the ground voltage level.

The operation in period T4 is the same as in the period T4 of FIG. 7 or the period T3 of FIG. 10 and includes operations in periods T41 and T42. In the period T41, when a voltage of 2 V is applied to the source line SLi, a voltage of −1 V is applied to the word line WLi, the low-level precharge control signals P1, P31, P22, etc. and the high-level precharge control signals P21 and P32 are applied, the NMOS transistors N1, N4, and N5 and the PMOS transistors P3 and P4 of the sense amplification unit SAB1 are turned of, the NMOS transistor N8 is turned on, the bit line BL1B is maintained at the level of the reference voltage VBL, the NMOS transistors N1, N4, N5, and N8 of the sense amplification units SAB2, etc. are turned off, the PMOS transistors P3 and P4 are turned on, and the bit lines BL2, BL2B, etc. are maintained at the level of the internal power supply voltage Va. When the data "1" is stored in the memory cell MC1, the bit line BL1 has the level of the voltage V1. When the data "0" is stored in the memory cell MC1, the bit line BL1 has the level of the voltage V0. Here, the bit lines BL1 and BL1B are respectively maintained at the V0 level and the VBL level, or the V1 level and the VBL level. In the period T42, when a low-level precharge control signal P32, a low-level sense amplifier control signal LAB, and a high-level sense amplifier control signal LA are applied, the PMOS sense amplifier PSA and the NMOS sense amplifier NSA of the sense amplification unit SAB1 are enabled, thereby sensing and amplifying a voltage difference between the bit lines BL1 and BL1B. Here, when a high-level column selection signal CSL1 is applied, the NMOS transistors N6 and N7 are turned on and voltages of the bit lines BL1 and BL1B are transferred to the pair of data input and output lines IO and IOB. Here, the sense amplifier control signals LA and LAB are applied to the sense amplifiers PSA and NSA of the sense amplification units SAB2, etc., but a level between the bit lines BL2, BL2B, etc. is the same as the internal power supply voltage Va, such that no voltage difference occurs. Therefore, the bit lines BL2, etc are maintained at the internal power supply voltage Va. Since the bit lines BL2, etc. are maintained at the internal power supply voltage Va, an operation of writing data to the memory cells connected between the lines WLi, SLi, BL2, etc. is prevented. Referring to the description related to FIG. 7, this will be readily understood.

Since the operation in period T5 is the same as in period T0, the bit lines BL1, BL1B, BL2, BL2B, etc. are precharged to the ground voltage level.

Referring to the description related to the operation in the period T6 of FIG. 7, the operation in period T6 will be readily understood.

In the above-described example embodiments, an example in which memory cells connected to at least one word line, all word lines of a memory cell array block, or all word lines of a memory cell array are simultaneously refreshed has been described. As another alternative, when the memory cell array has a plurality of memory cell array banks, memory cells connected to all word lines of a memory cell array bank may be simultaneously refreshed.

The voltage levels according to the above-described example embodiments may be replaced with other voltage levels in a regular range.

In the above-described example embodiments, an example in which the column controller 54 applies a voltage corresponding to a data state to bit lines when the write operation is performed has been described. As another alternative, a voltage corresponding to a data state may be directly applied to the bit lines through other means without use of the column controller 54 when the write operation is performed.

The semiconductor memory device may use a different method from the write and read operations according to the above-described example embodiments. In this regard, when the steady state of a memory cell using a floating body transistor is the data "1" state and a memory cell storing the data "0" is refreshed, a very low-level voltage is applied to the word line.

In this case, a bipolar current is smaller than that consumed when a memory cell storing the data "1" is refreshed, thereby reducing power consumption. Since at least one word line is sequentially refreshed or all word lines are simultaneously refreshed, a refresh time may be shortened.

In a semiconductor memory device including a message cell array having dynamic memory cells using a floating body transistor and a method of operating the same according to one or more example embodiments, memory cells storing data "1" are not refreshed, but memory cells storing data "0" are refreshed, thereby reducing current consumption and power consumption.

Memory cells connected to one word line are not sequentially refreshed, but memory cells connected to at least two word lines are sequentially refreshed, or memory cells connected to all word lines are simultaneously refreshed, thereby shortening a refresh time.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor memory device comprising a memory cell array including a plurality of memory cells, wherein each memory cell includes a transistor with a floating body region in which majority carriers are accumulated in a steady state,
wherein in write and read operations, a data "1" state corresponding to the steady state is written to and read from at least one selected memory cell of the memory cell array by flowing a first bipolar current through the at least one selected memory cell, and a data "0" state is written to and read from the at least one selected memory cell by flowing a second bipolar current which is smaller than the first bipolar current through the at least one selected memory cell,
wherein in a refresh operation, memory cells of the memory cell array storing the data "0" state are refreshed, discharging the majority carriers from the floating body region of each of the memory cells storing the data "0" state to prevent accumulation of the majority carriers before the data "0" state changes to the data "1" state, and
wherein the memory cells of the memory cell array storing the data "1" state are not affected by the refresh operation.

2. The semiconductor memory device of claim 1, wherein the memory cell array further includes a plurality of word lines, a plurality of source lines, and a plurality of bit lines, wherein the transistor of each memory cell is connected to a respective source line, one bit line and word line.

3. The semiconductor memory device of claim 2, further comprising a controller configured to apply a write control signal to at least one word line and at least one source line in the write operation, to apply a read control signal to the at least one word line and the at least one source line in the read operation, and to apply a refresh control signal to the at least one word line in the refresh operation.

4. The semiconductor memory device of claim 3, wherein in the refresh operation, the controller applies, as the refresh control signal, a voltage that is lower than or equal to a voltage applied to the at least one word line in the write and read operations.

5. The semiconductor memory device of claim 1, wherein the second bipolar current is substantially zero.

6. The semiconductor memory device of claim 3, wherein in the refresh operation, the controller simultaneously applies the refresh control signal to the plurality of word lines or sequentially applies the refresh control signal to the plurality of word lines.

7. The semiconductor memory device of claim 3, wherein the plurality of word lines and the plurality of source lines are arranged in the same direction and the plurality of bit lines are arranged in a direction orthogonal to the plurality of word lines in the memory cell array, and
wherein a source of each transistor of each memory cell is connected to a corresponding source line among the plurality of source lines, a gate of each transistor of each memory cell is connected to a corresponding word line among the plurality of word lines, and drains of transistors of two adjacent memory cells among the plurality of memory cells are commonly connected to a corresponding bit line among the plurality of bit lines.

8. The semiconductor memory device of claim 3, wherein the memory cell array includes a plurality of memory cell array blocks, and the refresh operation is performed on each block by simultaneously applying the refresh control signal to all word lines of each block.

9. The semiconductor memory device of claim 8, wherein the memory cell array further includes sensing blocks between the plurality of memory cell array blocks, and in a first period of the read operation, the controller is configured to activate a first precharge control signal when at least one first memory cell connected to a first bit line among the plurality of bit lines is selected, and to activate a second precharge control signal when at least one second memory cell connected to a second bit line is selected,
wherein each of the sensing blocks includes:
a precharge unit configured to set the second bit line to a reference voltage when the first memory cell is selected, and to set the first bit line to the reference voltage when the second memory cell is selected, in the first period of the read operation; and a sense amplifier connected between the first bit line and the second bit line among the plurality of bit lines and configured to sense and amplify a voltage difference between the first bit line and the second bit line in the second period of the read operation.

10. The semiconductor memory device of claim 9, wherein the reference voltage is set between a voltage of a bit line when a memory cell storing the first data state is read and a voltage of a bit line when a memory cell storing the second data state is read.

11. The semiconductor memory device of claim 3, wherein in the memory cell array, the plurality of word lines and the plurality of source lines are arranged in the same direction and the plurality of bit lines are arranged in a direction orthogonal to the plurality of word lines, and
wherein transistors of two adjacent memory cells among the plurality of memory cells include sources commonly connected to a corresponding source line among the plurality of source lines, gates connected to a corresponding word line among the plurality of word lines, and drains commonly connected to a corresponding bit line among the plurality of bit lines.

12. A semiconductor memory device, comprising:
a memory cell array including a plurality of memory cells, a plurality of word lines, a plurality of source lines and a plurality of bit lines, wherein each memory cell includes a transistor with a floating body region in which majority carriers are accumulated in a steady state, and wherein the transistor of each memory cell is connected to a respective source line, one bit line and word line; and
a controller configured to apply a write control signal to at least one word line and at least one source line in the write operation, to apply a read control signal to the at least one word line and the at least one source line in the read operation, and to apply a refresh control signal to the at least one word line in a refresh operation,
wherein in write and read operations, a data "1" state corresponding to the steady state is written to and read from at least one selected memory cell of the memory cell array by flowing a first bipolar current through the at least one selected memory cell, and a data "0" state is written to and read from the at least one selected memory cell by flowing a second bipolar current which is smaller than the first bipolar current through the at least one selected memory cell,
wherein in the refresh operation, memory cells of the memory cell array storing the data "0" state are refreshed,
wherein a source of each transistor of each memory cell is connected to a corresponding source line among the plurality of source lines, a gate of each transistor of each memory cell is connected to a corresponding word line among the plurality of word lines, and drains of transistors of two adjacent memory cells among the plurality of memory cells are commonly connected to a corresponding bit line among the plurality of bit lines, and
wherein the controller is configured to respectively apply a signal of a first voltage and a signal of a second voltage that is higher than the first voltage to the word line and the source line, as the write control signal, in a first period of the write operation, to respectively apply a signal of a third voltage that is lower than the first voltage and the signal of the second voltage to the at least one word line and the at least one source line, as the write control signal, in a second period of the write operation, to respectively apply the signal of the third voltage and the signal of the second voltage to the at least one word line and the at least one source line, as the read control signal, in the read operation, and to apply the first voltage or a fourth voltage that is between the third voltage and the first voltage to the at least one word line, and the first voltage to the plurality of source lines and the plurality of bit lines, as the refresh control signal, in the refresh operation.

13. The semiconductor memory device of claim 12, wherein after data is applied to the at least one bit line in the first period, the controller is configured to apply the second voltage to the at least one source line and the first voltage to the at least one word line, and
after the third voltage is applied to the at least one word line in the second period, the controller is configured to apply the signal of the first voltage to the at least one source line and terminates the operation of applying the data to the at least one bit line.

14. The semiconductor memory device of claim 13, wherein in a data retention operation, the controller is configured to apply a data retention control signal to each of the plurality of word lines, the plurality of source lines, and the plurality of bit lines,
wherein the data retention control signal includes the signal of the first voltage, the signal of the first voltage, and the signal of the third voltage respectively applied to the plurality of word lines, the plurality of source lines, and the plurality of bit lines.

15. The semiconductor memory device of claim 12, wherein in the first and second periods of the write operation and the read operation, the controller is configured to apply a signal of a fifth voltage that is higher than the first voltage and lower than the second voltage to a bit line of at least one non-selected memory cell.

16. A semiconductor memory device, comprising:
a memory cell array including a plurality of memory cells, a plurality of word lines, a plurality of source lines and a plurality of bit lines, wherein each memory cell includes a transistor with a floating body region in which majority carriers are accumulated in a steady state, and wherein the transistor of each memory cell is connected to a respective source line, one bit line and word line; and
a controller configured to apply a write control signal to at least one word line and at least one source line in the write operation, to apply a read control signal to the at least one word line and the at least one source line in the read operation, and to apply a refresh control signal to the at least one word line in a refresh operation,
wherein in write and read operations, a data "1" state corresponding to the steady state is written to and read from at least one selected memory cell of the memory cell array by flowing a first bipolar current through the at least one selected memory cell, and a data "0" state is written to and read from the at least one selected memory cell by flowing a second bipolar current which is smaller than the first bipolar current through the at least one selected memory cell,
wherein in the refresh operation, memory cells of the memory cell array storing the data "0" state are refreshed,
wherein transistors of two adjacent memory cells among the plurality of memory cells include sources commonly connected to a corresponding source line among the plurality of source lines, gates connected to a corresponding word line among the plurality of word lines, and drains commonly connected to a corresponding bit line among the plurality of bit lines, wherein the controller is configured to respectively apply a signal of a first voltage and a signal of a second voltage that is higher than the first voltage to the at least one word line and the at least one source line, as the write control signal, in the write operation, wherein the controller is configured to respectively apply a signal of a third voltage that is lower than the first voltage and the signal of the second voltage to the at least one word line and the at least one source line, as the read control signal, in the read operation, and wherein the controller is configured to apply the first voltage or a fourth voltage that is between the third voltage and the first voltage to the at least one word line, and the first voltage to the plurality of source lines and the plurality of bit lines, as the refresh control signal, in the refresh operation.

17. The semiconductor memory device of claim 16, wherein after data is applied to the at least one bit line in the write operation, the controller is configured to apply the signal of the second voltage to the at least one source line and the signal of the first voltage to the at least one word line, and after a signal of a fifth voltage that is lower than the third voltage is applied to the at least one word line, the controller is configured to apply the signal of the first voltage to the at least one source line and terminates the operation of applying the data to the at least one bit line.

18. The semiconductor memory device of claim 17, wherein in a data retention operation, the controller is configured to apply a data retention control signal to each of the plurality of word lines, the plurality of source lines, and the plurality of bit lines, wherein the data retention control signal includes the signal of the fifth voltage, the signal of the first voltage, and the signal of the first voltage respectively applied to the plurality of word lines, the plurality of source lines, and the plurality of bit lines.

19. The semiconductor memory device of claim 16, wherein in the write and read operations, the controller is configured to apply a signal of a sixth voltage that is higher than the first voltage and lower than the second voltage, to a bit line of at least one non-selected memory cell.

* * * * *